US012604785B2

(12) United States Patent
Chang Chien

(10) Patent No.: US 12,604,785 B2
(45) Date of Patent: Apr. 14, 2026

(54) PACKAGE STRUCTURE AND MANUFACTURING METHOD THEREOF

(71) Applicant: POWERTECH TECHNOLOGY INC., Hsinchu County (TW)

(72) Inventor: Shang-Yu Chang Chien, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 519 days.

(21) Appl. No.: 18/083,579

(22) Filed: Dec. 19, 2022

(65) Prior Publication Data

US 2024/0030121 A1     Jan. 25, 2024

(30) Foreign Application Priority Data

Jul. 19, 2022     (TW) .................................. 111127038

(51) Int. Cl.
    *H10W 90/00*          (2026.01)
    *H10W 70/05*          (2026.01)
             (Continued)
(52) U.S. Cl.
    CPC ......... *H10W 90/401* (2026.01); *H10W 70/05* (2026.01); *H10W 70/095* (2026.01);
             (Continued)
(58) Field of Classification Search
    CPC ............. H01L 21/4857; H01L 23/3128; H01L 23/49816; H01L 23/49822;
             (Continued)

(56) References Cited

U.S. PATENT DOCUMENTS

2011/0291249 A1 *  12/2011  Chi ..................... H01L 23/5389
                                                         438/122
2014/0327125 A1 *  11/2014  Chen ................... H01L 23/3135
                                                         438/107
                 (Continued)

FOREIGN PATENT DOCUMENTS

CN          106935519 A      7/2017
TW          201926631 A      7/2019
                 (Continued)

*Primary Examiner* — Jessica S Manno
*Assistant Examiner* — Sandra Milena Rodriguez Villanu
(74) *Attorney, Agent, or Firm* — Winston Hsu

(57)          ABSTRACT

A package structure and a manufacturing method thereof are provided. The package structure includes a redistribution layer, a conductive pillar, an active chip, an encapsulation layer, and another redistribution layer. The conductive pillar and the active chip are side by side disposed on the redistribution layer. The encapsulation layer surrounds the active chip and the conductive pillar, in which the encapsulation layer has a first through hole disposed between the active chip and the redistribution layer and a second through hole disposed between the conductive pillar and the redistribution layer, and a depth of the first through hole is less than a depth of the second through hole. The another redistribution layer is disposed on a side of the redistribution layer away from the redistribution layer and electrically connected to the redistribution layer through the conductive pillar.

13 Claims, 8 Drawing Sheets

(51) Int. Cl.

| | |
|---|---|
| *H10W 70/65* | (2026.01) |
| *H10W 70/685* | (2026.01) |
| *H10W 70/69* | (2026.01) |
| *H10W 74/01* | (2026.01) |
| *H10W 74/10* | (2026.01) |
| *H10W 72/00* | (2026.01) |
| *H10W 74/00* | (2026.01) |
| *H10W 74/40* | (2026.01) |

(52) U.S. Cl.
CPC ......... *H10W 70/65* (2026.01); *H10W 70/685* (2026.01); *H10W 70/69* (2026.01); *H10W 74/014* (2026.01); *H10W 74/017* (2026.01); *H10W 74/117* (2026.01); *H10W 90/00* (2026.01); *H10W 90/701* (2026.01); *H10W 72/0198* (2026.01); *H10W 74/00* (2026.01); *H10W 74/10* (2026.01); *H10W 74/40* (2026.01); *H10W 90/734* (2026.01); *H10W 90/794* (2026.01)

(58) Field of Classification Search
CPC ......... H01L 23/49838; H01L 23/49894; H01L 24/08; H01L 24/32; H01L 24/96; H01L 24/97; H01L 2224/08235; H01L 2224/96; H01L 2224/97; H01L 2225/1035; H01L 23/5389; H01L 2225/1041; H01L 2225/1058; H01L 24/20; H01L 25/105; H01L 2224/023; H01L 21/56; H01L 21/565; H10W 90/401; H10W 90/734; H10W 90/794; H10W 70/09; H10W 70/60; H10W 70/614; H10W 90/722; H10W 74/019; H10P 72/7424; H10P 72/743; H10P 72/744; H10P 72/74
See application file for complete search history.

(56) References Cited

U.S. PATENT DOCUMENTS

| | | | |
|---|---|---|---|
| 2018/0301396 A1* | 10/2018 | Pan ..................... | H01L 23/5222 |
| 2019/0164893 A1* | 5/2019 | Kim .................. | H01L 23/49827 |
| 2020/0328144 A1* | 10/2020 | Fan .......................... | H01L 21/56 |
| 2021/0225699 A1* | 7/2021 | Tseng ..................... | H01L 24/19 |
| 2022/0285319 A1* | 9/2022 | Miura ................. | H01L 25/0652 |

FOREIGN PATENT DOCUMENTS

| | | | |
|---|---|---|---|
| TW | 202038405 A | 10/2020 | |
| TW | 202129858 A | 8/2021 | |

* cited by examiner

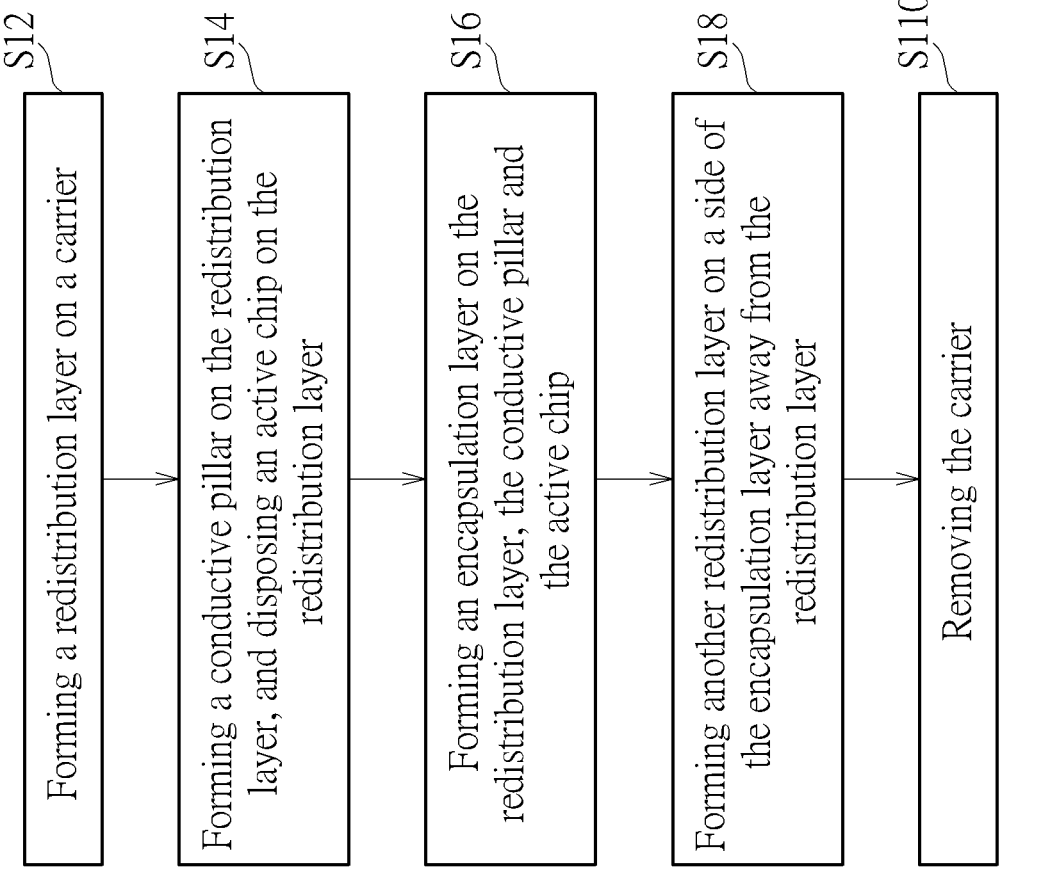

S12

Forming a redistribution layer on a carrier

S14

Forming a conductive pillar on the redistribution layer, and disposing an active chip on the redistribution layer

S16

Forming an encapsulation layer on the redistribution layer, the conductive pillar and the active chip

S18

Forming another redistribution layer on a side of the encapsulation layer away from the redistribution layer

S110

Removing the carrier

PACKAGE STRUCTURE AND MANUFACTURING METHOD THEREOF

BACKGROUND OF THE INVENTION

1. Field of the Invention

The present invention relates to a package structure and a manufacturing method thereof, and particularly to a package structure has an active chip disposed between two redistribution layers and a manufacturing method thereof.

2. Description of the Prior Art

With the advancement of semiconductor technology, circuit density in a chip tends to be higher so as to improve operation performance and reduce a size of the chip. In conventional chip design, a thickness of the chip is usually increased to facilitate heat dissipation of the chip. Accordingly, when the chip is packaged, heights of conductive pillars need to be increased, such that the heights of the conductive pillars are greater than the thickness of the chip. However, as the thickness of the photoresist layer used for forming the conductive pillars is higher, apertures of through holes are greater, which limits distribution density of the conductive pillars. Also, since the thickness of the photoresist layer is limited, the heights of the conductive pillars are unable to be continuously increased, thereby limiting the thickness of the chip capable of being packaged. As a result, to solve the issue that the thickness of the chip is limited is an objective for the person in the related art.

SUMMARY OF THE INVENTION

According to an embodiment of the present invention, a package structure is provided and includes a redistribution layer, a conductive pillar, an active chip, an encapsulation layer, and another redistribution layer. The conductive pillar and the active chip are disposed side by side on the redistribution layer, and the active chip includes a pad. The encapsulation layer surrounds the active chip and the conductive pillar, in which the encapsulation layer has a first through hole and a second through hole. The first through hole is disposed between the pad of the active chip and the redistribution layer, the second through hole is disposed between the conductive pillar and the redistribution layer, and a depth of the first through hole is less than a depth of the second through hole. The another redistribution layer is disposed on a side of the active chip away from the redistribution layer and electrically connected to the redistribution layer through the conductive pillar.

According to another embodiment of the present invention, a manufacturing method of a package structure is provided. First, a redistribution layer is formed on a carrier. Next, a conductive pillar is formed on the redistribution layer, and an active chip is disposed on the redistribution layer, in which the active chip has a pad disposed at a side of the active chip away from the redistribution layer. Then, an encapsulation layer is formed on the redistribution layer, the conductive pillar and the active chip, in which the encapsulation layer surrounds the conductive pillar and the active chip, and the encapsulation layer has a first through hole and a second through hole. The first through hole exposes the pad of the active chip, the second through hole exposes the conductive pillar, and a depth of the first through hole is less than a depth of the second through hole. Thereafter, another redistribution layer is formed on a side of the encapsulation layer away from the redistribution layer, and then the carrier is removed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 illustrates a flowchart of a manufacturing method of a package structure according to an embodiment of the present invention.

DETAILED DESCRIPTION

Figure 1:
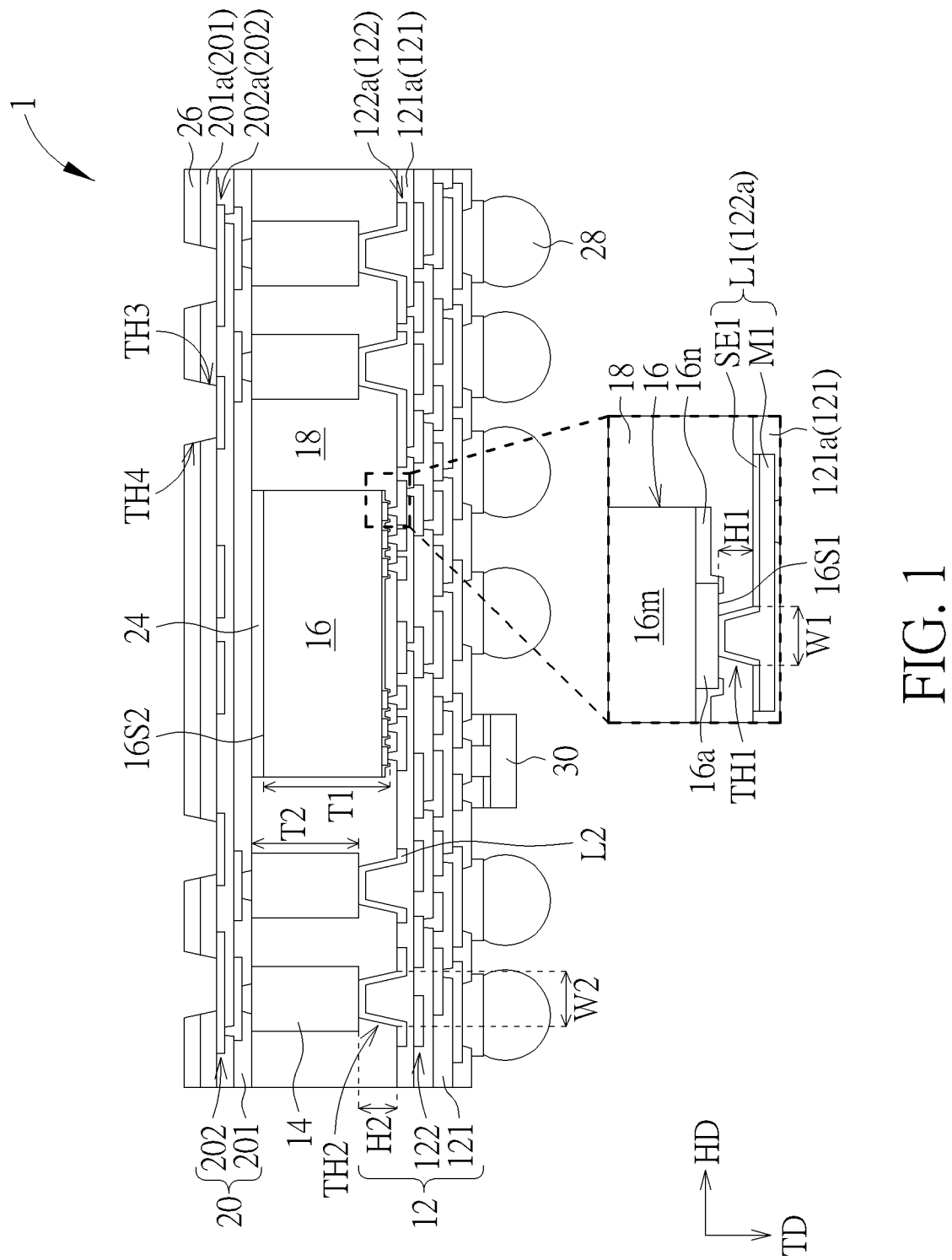
FIG. 1 is a schematic cross-sectional view of a package structure according to an embodiment of the present invention.

The contents of the present invention will be described in detail with reference to specific embodiments and drawings. It is noted that, for purposes of illustrative clarity and being easily understood by the readers, the following drawings may be simplified schematic diagrams, and components therein may not be drawn to scale. The numbers and sizes of the components in the drawings are just illustrative and are not intended to limit the scope of the present invention.

Spatially relative terms, such as "above", "on", "beneath", "below", "under", "left", "right", "before", "front", "after", "behind" and the like, used in the following embodiments just refer to the directions in the drawings and are not intended to limit the present invention. It may be understood that the components in the drawings may be disposed in any kind of formation known by those skilled in the related art to describe or illustrate the components in a certain way. Furthermore, when one component is mentioned to overlap another component, it may be understood that the component may partially or completely overlap the another component.

When one component or layer is "on" or "above" another component or layer, it may be understood that the component or layer is directly on the another component or layer, and alternatively, another component or layer may be between the one component or layer and the another component or layer (indirectly). On the contrary, when the component or layer is "directly on" the another component or layer, there is no intervening component or layer between the component or layer and the another component or layer.

As disclosed herein, when one component is referred to as being "electrically connected to" or "coupled to" another component, it will be understood that intervening components may be between the component and the another component and electrically connect the component to the another component, and alternatively, the component may be directly electrically connected to the another component without intervening components existing between them. If one component is referred to as being "directly electrically connected to" or "directly coupled to" another component, there are no intervening components present between them.

Please refer to FIG. 1, which is a schematic cross-sectional view of a package structure according to an embodiment of the present invention. As shown in FIG. 1, the package structure 1 provided in this embodiment may include a redistribution layer 12, at least one conductive pillar 14, at least one active chip 16, an encapsulation layer 18 and a redistribution layer 20. The conductive pillar 14, the active chip 16 and the encapsulation layer 18 may be disposed on the redistribution layer 12, and the encapsulation layer 18 may surround the conductive pillar 14 and the active chip 16. The redistribution layer 20 may be disposed on a side of the active chip 16 away from the redistribution layer 12 and electrically connected to the redistribution layer 12 through the conductive pillar 14. The active chip 16 may have at least one pad 16a, and the encapsulation layer 18 may have at least one first through hole TH1 and at least one second through hole TH2, in which the first through hole TH1 may be disposed between the pad 16a of the active chip 16 and the redistribution layer 12, and the second through hole TH2 may be disposed between the conductive pillar 14 and the redistribution layer 12.

It should be noted that the redistribution layer 12 may be electrically connected to the active chip 16 through the first through hole TH1 and electrically connected to the conductive pillar 14 through the second through hole TH2. Since a depth H1 of the first through hole TH1 is less than a depth H2 of the second through hole TH2, the redistribution layer 12 may be electrically connected to components, such as the conductive pillar 14 and the pad 16a, located on different planes. Therefore, a thickness T1 of the active chip 16 may not need to be less than a height T2 of the conductive pillar 14, thereby reducing or preventing the thickness T1 of the active chip 16 from being limited by the height T2 of the conductive pillar 14. With this arrangement, the thickness T1 of the active chip 16 may be increased for improving heat dissipation or other requirements. For example, the height T2 of the conductive pillar 14 may be less than or equal to the thickness T1 of the active chip 16. The thickness T1 of the active chip 16 may be, for example, greater than or equal to 200 micrometers (μm).

Specifically, the redistribution layer 12 may include at least one dielectric layer 121 and at least one conductive layer 122. In this embodiment, the redistribution layer 12 may include a plurality of dielectric layers 121 and a plurality of conductive layers 122, but not limited thereto. In some embodiments, the number of the conductive layers 122 and the number of the dielectric layers 121 in the redistribution layer 12 may be adjusted according to requirements.

In the redistribution layer 12 of the present embodiment, the conductive layers 122 and the dielectric layers 121 may be stacked alternately in sequence, and the redistribution layer 12 may electrically connect the components (e.g., the conductive pillar 14 and the active chip 16) located on the redistribution layer 12 to components located under the redistribution layer 12 (e.g., conductive terminals 28 and/or an electronic component 30). The dielectric layer 121 may have at least one through hole, such that two of the conductive layers 122 adjacent to one of the dielectric layers 121 and located on both sides of the one of the dielectric layers 121 may be electrically connected through the through hole. Accordingly, a lowermost conductive layer 122 may be electrically connected to an uppermost conductive layer 122. Each conductive layer 122 may include a plurality of traces or pads, and layout structure of the traces may be designed according to requirements. A distance between two adjacent traces or pads of any one of the conductive layers 122 may be adjusted to be different from or the same as another distance between another two adjacent traces or pads of any one of the conductive layers 122 according to the requirements. For example, a pad pitch (e.g., a fine pitch) of the uppermost conductive layer 122 may be less than a pad pitch the lowermost conductive layer 122, and/or a trace pitch of the conductive layer 122 closer to the active chip 16 may be less than a trace pitch of the conductive layer 122 farther away from the active chip 16 so as to have fan-out function, but not limited thereto.

As shown in FIG. 1, in a top view direction TD of the package structure 1, the first through hole TH1 may be disposed corresponding to the pad 16a of the active chip 16, and the second through hole TH2 may be disposed corresponding to the conductive pillar 14. In this embodiment, the number of the first through hole TH1, the number of the second through hole TH2, the number of the pad 16a, the number of the conductive pillar 14 may be plural as an example, but not limited thereto. The pads 16a of the active chip 16 may face the redistribution layer 12, so that the redistribution layer 12 may be directly electrically connected to the active chip 16 through the first through holes TH1, but the present invention is not limited thereto. The aperture W1 of one of the first through holes TH1 in a horizontal direction HD may for example be gradually increased as a distance of the aperture W1 of the first through hole TH1 from the active chip 16 increases. The minimum value of the aperture W1 of the first through hole TH1 may be for example less than a width of one of the pads 16a. The aperture W2 of one of the second through holes TH2 in the horizontal direction HD may for example be gradually increased as a distance of the aperture W2 of the second through hole TH2 from one of the conductive pillars 14 increases. The minimum value of the aperture W2 of one of the second through holes TH2 may be for example less than or equal to a width of one of the conductive pillars 14. Furthermore, the aperture W2 of one of the second through holes TH2 may be greater than the aperture W1 of one of the first through holes TH1. In this embodiment, a part of the encapsulation layer 18 may be further disposed between the redistribution layer 12 and the active chip 16, and a part of the encapsulation layer 18 may be located between the redistribution layer 12 and the conductive pillars 14, but not limited thereto. In some embodiments, the encapsulation layer 18 may not be located between the redistribution layer 12 and conductive pillars 14.

Figure 5:
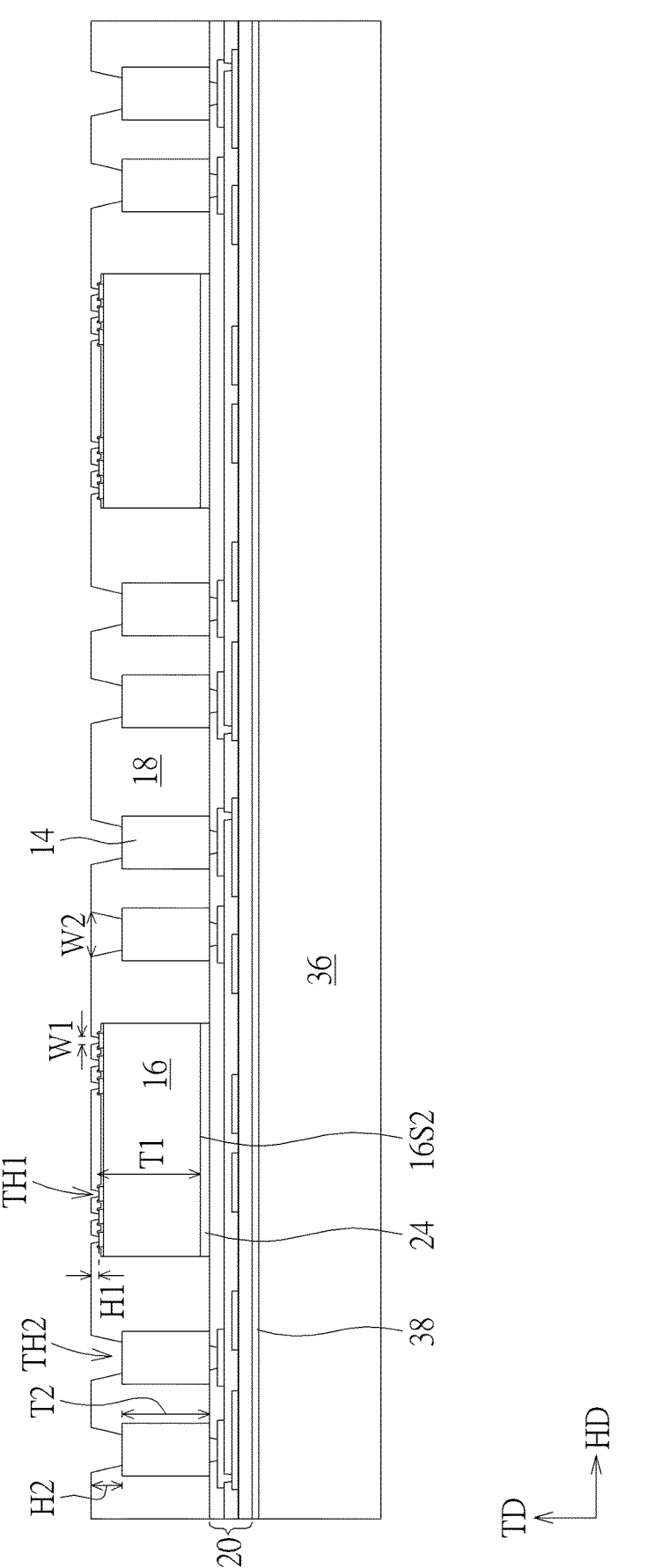

As shown in FIG. 1, the redistribution layer 12 may include at least one first trace L1 and at least one second trace L2. In this embodiment, the number of the first trace L1 and the number of the second trace L2 may be plural as an example, but not limited thereto. One of the first traces L1 may be disposed in at least one of the first through holes TH1 of the encapsulation layer 18 and electrically connected to at least one of the pads 16a of the active chip 16, and one of the second traces L2 may be disposed in at least one of the second through holes TH2 of the encapsulation layer 18 and electrically connected to at least one of the conductive pillars 14. In this embodiment, the first traces L1 may be disposed on a surface of the encapsulation layer 18 close to the redistribution layer 12 and extend into the first through holes TH1. A half of the aperture W1 of one of the first through holes TH1 may be, for example, less than or equal to a thickness of one of the conductive layers 122, so that the first traces L1 may fill up the first through holes TH1. Since the first through holes TH1 between the pads 16a and the redistribution layer 12 may expose the pads 16a (as shown in FIG. 5) during fabricating processes, one of the first traces L1 disposed in the first through holes TH1 may directly contact the corresponding pad 16*a*. In this case, there is no need to dispose conductive bumps on the pads 16*a* of the active chip 16, so that time and cost of fabricating the conductive bumps may be saved, and/or the thickness of the package structure 1 may be reduced.

As shown in FIG. 1, the depth H2 and a half of the aperture W2 of one of the second through holes TH2 may be greater than the thickness of one of the conductive layers 122, so one of the second traces L2 may be disposed along a sidewall of this second through hole TH2 and a surface of one of the conductive pillars 14 exposed by this second through hole TH2. In other words, one of the second traces L2 does not fill up the corresponding second through hole TH2, and this second trace L2 may be conformal to a stepped surface formed by a surface of the encapsulation layer 18, the sidewall of the corresponding second through hole TH2 and the surface of the corresponding conductive pillar 14. In this case, a part of the dielectric layer 121*a* (e.g., the uppermost dielectric layer 121*a*) adjacent to the second traces L2 may be disposed in the second through holes TH2. The dielectric layer 121*a* may, for example, fill up the second through holes TH2. It should be noted that, since the depth H1 of one of the first through holes TH1 may be less than the depth H2 of one of the second through holes TH2, the height of one of the first traces L1 in the top view direction TD may be less than the height of one of the second traces L2 in the top view direction TD. When the height T2 of one of the conductive pillars 14 is less than or equal to a distance between a surface of one of the pads 16*a* close to the redistribution layer 12 and the redistribution layer 20 (i.e., a sum of the thickness T1 of the active chip 16 and a thickness of an adhesive layer 24), one of the first traces L1 and one of the second traces L2 may still be electrically connected to the corresponding pad 16*a* and the corresponding conductive pillar 14, respectively, so as to solve the issue that the thickness T1 of the active chip 16 is limited. In some embodiments, the thickness of the adhesive layer 24 may be thin, so that the distance between the surface of one of the pads 16*a* close to the redistribution layer 12 and the redistribution layer 20 may be close to the thickness T1 of the active chip 16.

In this embodiment, the first traces L1 and the second traces L2 may be formed of the same conductive layer 122, for example, formed of the conductive layer 122*a* (i.e., the uppermost conductive layer 122*a*) closest to the encapsulation layer 18. Further, as shown in an enlarged view of a lower part of FIG. 1, the conductive layer 122*a* may include an interface layer SE1 and a metal layer M1, and the interface layer SE1 may be disposed between the metal layer M1 and the encapsulation layer 18 and between the metal layer M1 and the pads 16*a* (or the conductive pillars 14). Taking one of the first traces L1 as an example, the interface layer SE1 may be disposed along a lower surface of the encapsulation layer 18, the sidewall of the first through hole TH1 and the surface of the pad 16*a*, and the metal layer M1 may be disposed in the first through hole TH1. Although not shown, the interface layer SE1 of one of the second traces L2 may be disposed along the lower surface of the encapsulation layer 18, the sidewall of the corresponding second through hole TH2 and the surface of the corresponding conductive pillar 14, and the metal layer M1 is disposed on a surface of the interface layer SE1 away from the encapsulation layer 18. The interface layer SE1 may not only improve the adhesion between the metal layer M1 and the pads 16*a* (or the conductive pillars 14), but also improve the adhesion between the metal layer M1 and the encapsulation layer 18. The interface layer SE1 may be, for example, a seed layer or other suitable layers. The interface layer SE1 and the metal layer M1 may, for example, include copper, titanium, other suitable materials, or a combination of at least two of the mentioned above.

As shown in FIG. 1, the conductive pillars 14 and the active chip 16 may be disposed between the redistribution layer 12 and the redistribution layer 20. In the embodiment of FIG. 1, the active chip 16 may be electrically connected to the redistribution layer 12, and through the conductive pillars 14, the active chip 16 may be further electrically connected to the redistribution layer 20.

In the embodiment of FIG. 1, the number of the conductive pillars 14 may be plural, and the conductive pillars 14 may be distributed around the active chip 16 in a manner of surrounding the active chip 16, but not limited thereto. In some embodiments, the number of conductive pillars 14 may be at least one. In some embodiments, the conductive pillars 14 may include, for example, a single-layer or multi-layer structure. The conductive pillars 14 may include, for example, copper, nickel, tin, silver, other suitable materials, alloys of at least two of the mentioned above, or a combination of the mentioned above, but not limited thereto.

As shown in FIG. 1, the active chip 16 may further include a main portion 16*m* and an insulating layer 16*n*, in which the pads 16*a* may be disposed on the main portion 16*m*, and the insulating layer 16*n* may be disposed on the pads 16*a* and have openings exposing the corresponding pads 16*a* respectively. For example, the main portion 16*m* may include an integrated circuit, and the pads 16*a* may be aluminum pads, but not limited thereto. In some embodiments, the surface of the active chip 16 with the pads 16*a* may be referred to as an active surface 16S1, but not limited thereto. In this embodiment, the package structure 1 may further include the adhesive layer 24 for adhering a back surface 16S2 of the active chip 16 opposite to the active surface 16S1 to the redistribution layer 20, but the present invention is not limited thereto. The adhesive layer 24 may include, for example, a die attach film (DAF), double-sided tape, or other suitable materials. As mentioned herein, the horizontal direction HD may be, for example, parallel to the back surface 16S2 of the active chip 16, and the top-view direction TD may be, for example, perpendicular to the back surface 16S2 of the active chip 16.

As mentioned herein, the active chip 16 may refer to a chip that includes active components, and the active components may include transistors, diodes, integrated circuits, optoelectronic components, or other suitable components with gain. Herein, the chip may also be referred to as a die, but not limited thereto. The active chip 16 may include, for example, a power management integrated circuit (PMIC), a micro-electro-mechanical-system (MEMS) chip, an application-specific integrated circuit (ASIC), a dynamic random access memory (DRAM) chip, a static random access memory (SRAM) chip, a high bandwidth memory (HBM) chip, a system on chip (SoC), a high performance computing (HPC) chip or other similar active chip, but not limited thereto.

As shown in FIG. 1, the redistribution layer 20 may include at least one dielectric layer 201 and at least one conductive layer 202. In this embodiment, the redistribution layer 20 may include a plurality of dielectric layers 201 and a plurality of conductive layers 202, but not limited thereto. In some embodiments, the number of the conductive layers 202 and the number of the dielectric layers 201 in the redistribution layer 20 may be adjusted according to the requirements.

In the redistribution layer 20 of the present embodiment, the dielectric layers 201 and the conductive layers 202 may be stacked alternately in sequence, so that the components (e.g., the package component 32 shown in FIG. 2) located on the redistribution layer 20 may be electrically connected to the components (e.g., the conductive pillars 14) located under the redistribution layer 20 by the redistribution layer 20. One of the dielectric layers 201 may have at least one through hole, so that two of the conductive layers 202 adjacent to this dielectric layer 201 and located on both sides of this dielectric layer 201 may be electrically connected through the through hole. Accordingly, the lowermost conductive layer 202 may be electrically connected to the uppermost conductive layer 202. Each of the conductive layers 202 may include a plurality of traces or pads, and the layout structure of the traces may be designed according to the requirements. In this embodiment, the number of the conductive layers 202 of the redistribution layer 20 may for example be different from the number of the conductive layers 122 of the redistribution layer 12. As an example, the number of the conductive layers 122 of the redistribution layer 12 adjacent to the pads 16a of the active chip 16 may be greater than the number of the conductive layers 202 of the redistribution layer 20 away from the pads 16a.

As shown in FIG. 1, the package structure 1 may optionally further include an anti-warping layer 26 disposed on a side of the redistribution layer 20 away from the active chip 16 to reduce warpage of the package structure 1. For example, when the number of the dielectric layers 201 of the redistribution layer 20 is less than the number of the dielectric layers 121 of the redistribution layer 12, or when total number of the dielectric layers 201 and the conductive layers 202 of the redistribution layer 20 is less than total number of the dielectric layers 121 and the conductive layers 122 of the redistribution layer 12, the stresses on the upper and lower sides of the active chip 16 may be different, so that the package structure 1 is prone to warp. Installing the anti-warping layer 26 on the redistribution layer which has less number of the dielectric layers may facilitate balancing the stresses on the upper and lower sides of the active chip 16, thereby reducing warpage. A thickness of the anti-warping layer 26 may be, for example, at least twice the thickness of one of the dielectric layers 201. The thickness of the anti-warping layer 26 may be greater than 20 μm, for example. In addition, a Young's modulus of the anti-warping layer 26 may be greater than a Young's modulus of polyimide, for example. The anti-warping layer 26 may include, for example, a siloxane polymer (such as a molding material from Shin-Etsu Chemical in Japan), a dry film type solder resist material, an Ajinomoto laminated film (ABF) or other suitable materials.

As shown in FIG. 1, the redistribution layer 20 may include a conductive layer 202a and a dielectric layer 201a, in which the dielectric layer 201a may be disposed between the conductive layer 202a and the anti-warping layer 26. The dielectric layer 201a may have a plurality of third through holes TH3, the anti-warping layer 26 may have a plurality of fourth through holes TH4, and the third through holes TH3 and the corresponding fourth through holes TH4 may expose the conductive layer 202a.

As shown in FIG. 1, the package structure 1 may optionally further include a plurality of conductive terminals 28 disposed on a side of the redistribution layer 12 away from the active chip 16 and used for being bonded and electrically connected to other components. In this embodiment, the package structure 1 may optionally include an electronic component 30 disposed on the side of the redistribution layer 12 away from the active chip 16 and electrically connected to the redistribution layer 12. For example, the electronic component 30 may be a chip including active components and/or passive components. The electronic component 30 may include, for example, a multilayer ceramic capacitor (MLCC), an integrated passive device (IPD), or other suitable devices.

Figure 2:
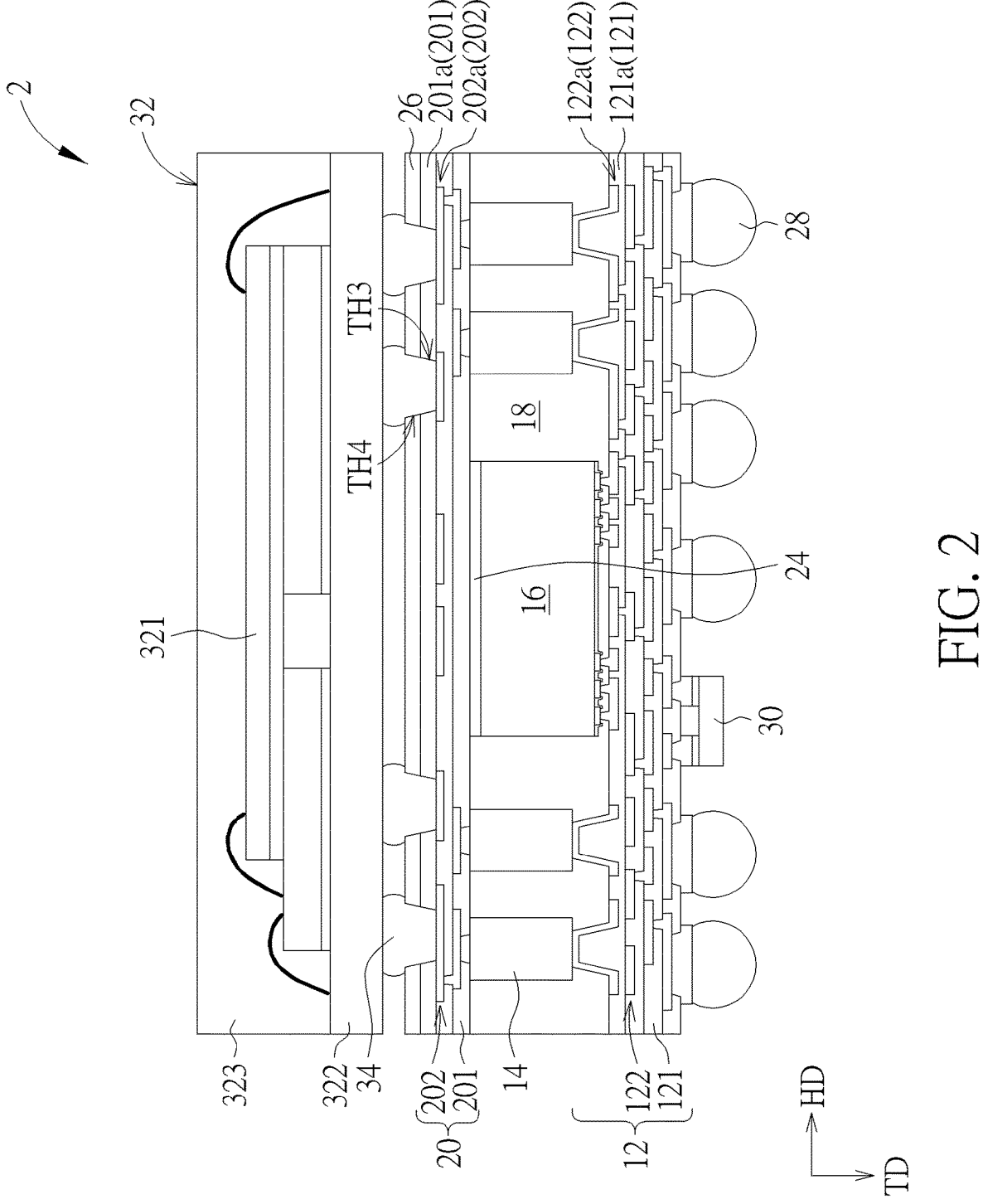
FIG. 2 is a schematic cross-sectional view of a package structure according to another embodiment of the present invention.

FIG. 2 is a schematic cross-sectional view of a package structure according to another embodiment of the present invention. As shown in FIG. 2, the package structure 2 of this embodiment differs from the package structure 1 shown in FIG. 1 in that the package structure 2 may further include at least one package component 32 disposed on the redistribution layer 20. The package component 32 may be bonded and electrically connected to the redistribution layer 20 through the conductive terminals 34. For example, each conductive terminal 34 may be disposed in the corresponding third through hole TH3 and the corresponding fourth through hole TH4. The package component 32 may, for example, include at least one chip 321, a circuit layer 322, an encapsulation layer 323 and/or other suitable components, in which the encapsulation layer 323 may, for example, seal the chip 321 on the circuit layer 322, and the chip 321 may be electrically connected to the conductive terminals 34 through the circuit layer 322, thereby being electrically connected to the redistribution layer 20. The circuit layer 322 may include at least one dielectric layer and at least one conductive layer and may be used for electrically connecting the chip 321 to the redistribution layer 20. The chip 321 may be, for example, a power management chip, a MEMS chip, a memory chip, a system chip, a HPC chip, or other similar chips. The circuit layer 322 may include, for example, a redistribution layer, a circuit board, or other layers or substrates with circuits. The package component 32 of the present invention is not limited to the mentioned above, and may be a component of any form or type. The other parts of the package structure 2 in this embodiment may be the same as the package structure 1, and therefore are not described again.

Please refer to FIG. 3 to FIG. 8. FIG. 3 illustrates a flowchart of a manufacturing method of a package structure according to an embodiment of the present invention, and FIG. 4 to FIG. 8 schematically illustrate cross-sectional views of structures in different steps of the manufacturing method of the package structure according to the embodiment of the present invention. As shown in FIG. 3, the manufacturing method provided by this embodiment may include, for example, step S12 to step S110 performed in sequence, and will be described in detail below with reference to FIG. 1 and FIG. 4 to FIG. 8. In some embodiments, another step may be performed before or after step S12 to step S110, between any two of step S12 to step S110, or during performing any one of step S12 to step S110.

Figure 4:
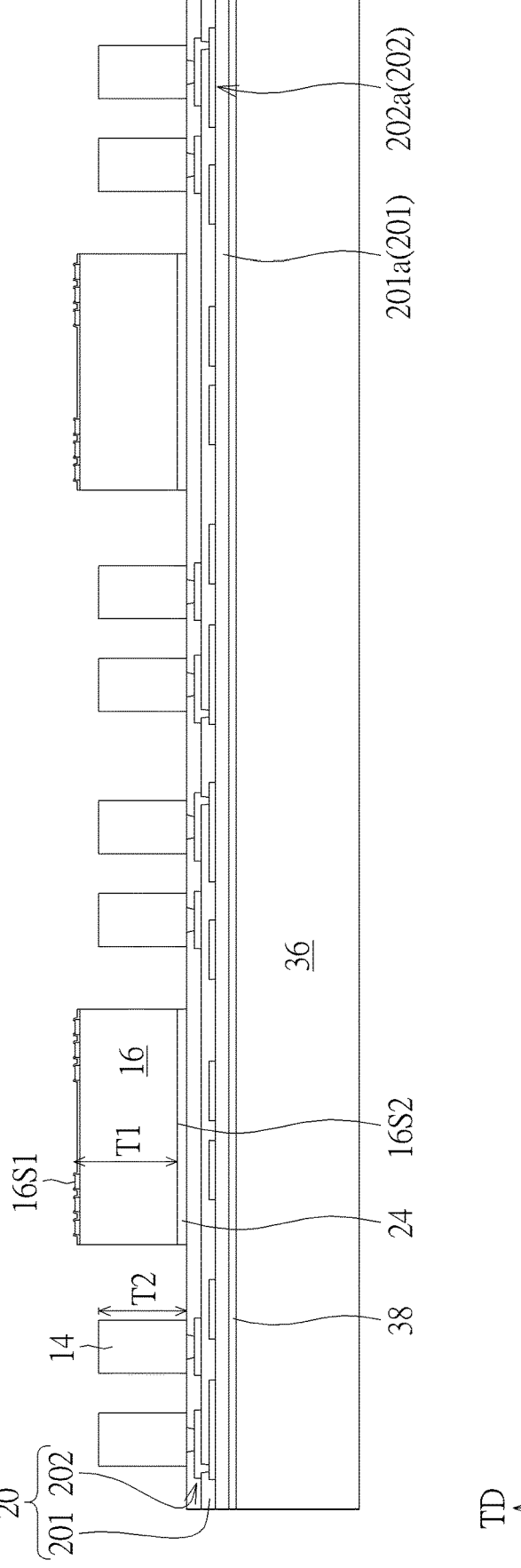
FIG. 4 to FIG. 8 schematically illustrate cross-sectional views of structures in different steps of the manufacturing method of the package structure according to the embodiment of the present invention.

As shown in FIG. 3 and FIG. 4, in step S12, the carrier 36 is provided first. Then, the redistribution layer 20 is formed on the carrier 36. A manner of forming the redistribution layer 20 may be for example to alternately form the dielectric layers 201 and the conductive layers 202 in sequence. The dielectric layers 201 may, for example, include polyimide or other suitable materials. The conductive layers 202 may include copper, nickel, aluminum, tungsten, other suitable materials, or a combination thereof. It should be noted that, the dielectric layer 201a of the redistribution layer closest to the carrier 36 in the present embodiment may not have through holes in step S12, but not limited thereto.

In this embodiment, the carrier 36 may optionally have a release layer 38, and the redistribution layer 20 is formed on the release layer 38, but not limited thereto. The carrier 36 may be used to support layers or components formed thereon, and the carrier 36 may include, for example, glass, wafer substrate, metal, or other suitable supporting materials, but not limited thereto. The release layer 38 may be used to separate the carrier 36 from the components formed thereon (e.g., a semi-finished structure 1a shown in FIG. 7) after subsequent steps are completed. The releasing manner of the release layer 38 may include, for example, photo dissociation or other suitable manners. The release layer 38 may include, for example, polyethylene (PE), polyethylene terephthalate (PET), epoxy, oriented polypropylene (OPP), or other suitable materials, but not limited thereto.

As shown in FIG. 3 and FIG. 4, in step S14, the conductive pillars 14 are formed on the redistribution layer 20, and the active chip 16 is disposed on the redistribution layer 20. In this embodiment, the conductive pillars 14 may be formed on the redistribution layer 20 before disposing the active chip 16, but not limited thereto. The back surface 16S2 of the active chip 16 may be attached to the redistribution layer 20 through the adhesive layer 24 in a manner of the active surface 16S1 facing upward (i.e., the pads 16a facing toward a side of the active chip 16 away from the redistribution layer 20). It is noted that the conductive pillars 14 and the active chip 16 are disposed on the redistribution layer 20 side by side, so that surfaces of the conductive pillars 14 close to the redistribution layer 20 and a surface of the adhesive layer 24 close to the redistribution layer 20 may be located on the same plane, for example. In this embodiment, the pads 16a of the active chip 16 do not have bumps, and in this case, the height T2 of one of the conductive pillars 14 may be less than a distance between a surface of one of the pads 16a away from the redistribution layer 20 and the redistribution layer 20 that is a sum of the thickness T1 of the active chip 16 and the thickness of the adhesive layer 24. For example, the height T2 of one of the conductive pillars 14 may be less than the thickness T1 of the active chip 16.

As shown in FIG. 3 and FIG. 5, in step S16, the encapsulation layer 18 is formed on the redistribution layer 20, the conductive pillars 14 and the active chip 16. The encapsulation layer 18 may include for example a photosensitive encapsulant material, a molding compound, or other suitable encapsulant materials, but is not limited thereto. The photosensitive encapsulant material may include siloxane polymer (e.g., SINR from Shin-Etsu Chemical in Japan), or other suitable organic materials. The molding compound may, for example, include epoxy or other suitable materials. In this embodiment, the encapsulation layer 18 may be, for example, a dry film type photosensitive encapsulant material. The encapsulation layer 18 may be disposed on the conductive pillars 14 and the active chip 16 through a lamination process and may surround the conductive pillars 14 and the active chip 16.

Then, the first through holes TH1 and the second through holes TH2 are formed in the encapsulation layer 18. The first through holes TH1 may respectively expose the corresponding pads 16a of the active chip 16, and the second through holes TH2 may respectively expose the corresponding conductive pillars 14. In this embodiment, when the encapsulation layer 18 may include for example the photosensitive encapsulant material, the first through holes TH1 and the second through holes TH2 may be formed, for example, through a photolithography process (i.e., an exposure process in combination with a development process) or the photolithography process further in combination with an etching process. In this case, the pads 16a are not easily damaged during forming the first through holes TH1 and the second through holes TH2, so that there is no need to form conductive bumps on the pads 16a, thereby saving the time and cost of fabricating the conductive bumps and/or reducing the thickness of the encapsulation structure 1 formed subsequently. In addition, since the height T2 of one of the conductive pillars 14 may be less than the distance between the surface of one of the pads 16a away from the redistribution layer 20 and the redistribution layer 20, the depth H2 of one of the second through holes TH2 may be greater than the depth H1 of one of the first through holes TH1, but not limited thereto. In addition, the aperture W2 of one of the second through holes TH2 may also be greater than the aperture W1 of one of the first through holes TH1, but not limited thereto. It should be noted that, since the first through holes TH1 and the second through holes TH2 having different depths may be formed by the same process, the manufacturing cost may be reduced, and/or the manufacturing steps may be simplified.

In some embodiments, when the encapsulation layer 18 includes the molding material, the first through holes TH1 and the second through holes TH2 may be formed by, for example, a laser drilling process. In this case, in order to reduce or prevent the pads 16a from being damaged by the laser drilling process, conductive bumps may be optionally formed on the pads 16a before the active chip 16 is disposed on the redistribution layer 20.

Figure 6:
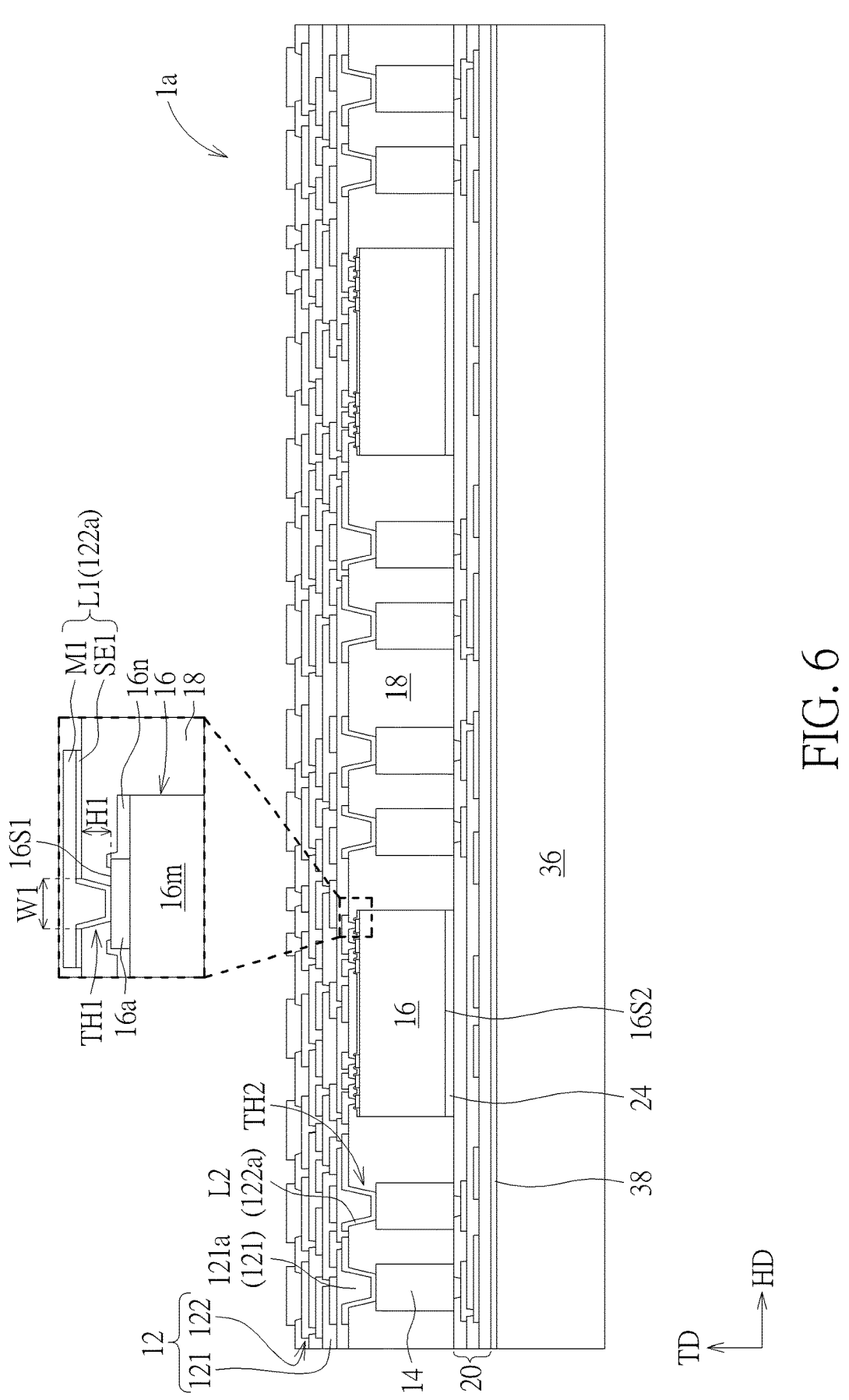

As shown in FIG. 3 and FIG. 6, in step S18, the redistribution layer 12 is formed on the encapsulation layer 18, the pads 16a and the conductive pillars 14, thereby forming a semi-finished structure 1a. A manner of forming the redistribution layer 12 may be for example to alternately form the conductive layers 122 and the dielectric layers 121 in sequence. In this embodiment, the conductive layer 122a closest to the active chip 16 (i.e., the conductive layer 122a formed first) may be formed on an upper surface of the encapsulation layer 18 and formed in the first through holes TH1 and the second through holes TH2 of the encapsulation layer 18. Since the aperture W2 of each of the second through holes TH2 (as shown in FIG. 5) is greater than the aperture W1 of each of the first through holes TH1, the conductive layer 122a may not fill up the second through holes TH2 but fill up the first through holes TH1. The dielectric layer 121a formed right after the conductive layer 122a is formed may be formed on the conductive layer 122a and fill the second through holes TH2; for example, the dielectric layer 121a may further fill up the second through holes TH2.

In some embodiments, a manner of forming the conductive layer 122a may include, for example, forming an interface layer SE1 on the encapsulation layer 18, forming a patterned photoresist layer (not shown) with through holes on the interface layer SE1 to expose portions of the interface layer SE1, forming a metal layer M1 on the exposed interface layer SE1, and then removing the patterned photoresist layer and portions of the interface layer SE1 where the metal layer M1 is not formed on. A manner of forming the interface layer SE1 may include, for example, a physical vapor deposition (PVD) process or other suitable processes. A manner of forming the metal layer M1 may include, for example, an electroplating process or other suitable processes. In addition, manners of forming other conductive layers 122 may be the same as or similar to the manner of forming the conductive layer 122a and will not be repeated herein. Materials of the dielectric layers 121 may be, for example, the same as or similar to the materials of the dielectric layers 201. Materials of the conductive layers 122 may be the same as or similar to the materials of the conductive layers 202, for example.

Figure 7:
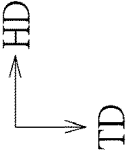

As shown in FIG. 3 and FIG. 7, in step S110, the carrier 36 and the release layer 38 are removed to expose the dielectric layer 201*a* of the redistribution layer 20 that is closest to the carrier 36. A manner of removing the carrier 36 may include, for example, irradiating the release layer 38 with light to reduce adhesion of the release layer 38, thereby removing the carrier 36, but not limited thereto. Then, the semi-finished structure 1*a* may be turned upside down, and the anti-warping layer 26 may be optionally disposed on the side of the redistribution layer 20 away from the active chip 16. A manner of disposing the anti-warping layer 26 may include, for example, a lamination process or other suitable processes. Subsequently, the fourth through holes TH4 are formed in the anti-warping layer 26, and the third through holes TH3 are formed in the dielectric layer 201*a* away from the active chip 16. In this embodiment, the third through holes TH3 and the fourth through holes TH4 may be formed by the same process so as to reduce the manufacturing cost and/or simplify the process steps, but not limited thereto. In this case, a sidewall of one of the third through holes TH3 may be coplanar with a sidewall of the corresponding fourth through hole TH4. The third through holes TH3 and the fourth through holes TH4 may be formed by, for example, a laser drilling process, a dry etching process or other suitable processes.

Figure 8:
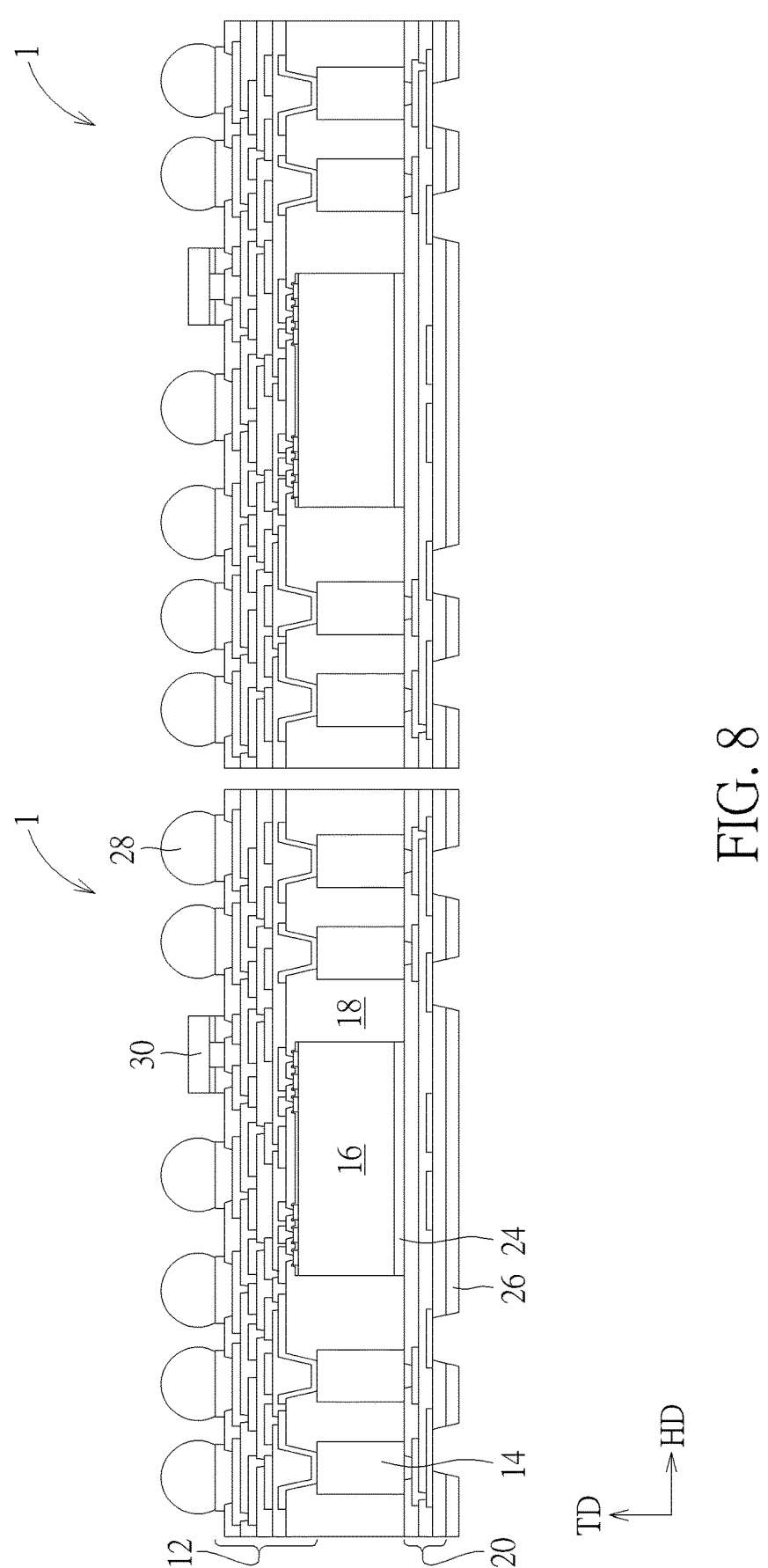

As shown in FIG. 8, after the carrier 36 is removed, the conductive terminals 28 may be provided on the side of the redistribution layer 12 away from the active chip 16. A manner of disposing the conductive terminals 28 may include, for example, electroplating, deposition, ball mounting, reflow, and/or other suitable processes. The conductive terminals 28 may, for example, include solder balls, conductive bumps, or other suitable conductive terminals. Solder balls may include tin balls, for example. The conductive bumps may include, for example, a multi-layer structure. The conductive bumps may include, for example, copper, nickel, tin, silver, other suitable materials, an alloy of at least two thereof, or a combination thereof, but not limited thereto. In some embodiments, the electronic component 30 may be optionally disposed on the side of redistribution layer 12 away from the active chip 16 between removing the carrier 36 and disposing the conductive terminals 28 or after disposing the conductive terminals 28.

As shown in FIG. 8, after the conductive terminals 28 or the electronic component 30 are formed, a singulation process may be optionally performed to form at least one package structure 1, as shown in FIG. 1. The singulation process may, for example, include a dicing process or other suitable processes. In the embodiment shown in FIG. 7 and FIG. 8, since the semi-finished structure 1*a* may include at least two active chips 16, the singulation process may separate different active chips 16 from each other to format least two package structures 1, but not limited thereto. In some embodiments, when the semi-finished structure 1*a* is only used for a single package structure 1, the singulation process may not be required, but not limited thereto.

In some embodiments, as shown in FIG. 2, after the package structure 1 is formed, the package component 32 may be further disposed on the side of the redistribution layer 20 away from the active chip 16. For example, the conductive terminals 34 may be disposed under the circuit layer 322 of the package component 32 first, and then the package component 32 is bonded to the redistribution layer 20 in a manner that the conductive terminals 34 correspond to the fourth through holes TH4. For example, the package component 32 may be referred to as the mentioned above, and the conductive terminals 34 may be, for example, the same as or similar to the conductive terminals 28, so they will not be mentioned redundantly.

In summary, in the package structure of the present invention, since the encapsulation layer has the first through holes and the second through holes of different depths, the active chip and the conductive pillars respectively corresponding to the first through holes and the second through holes may be electrically connected to the same redistribution layer. Accordingly, the thickness of the active chip does not need to be less than the heights of the conductive pillars, so as to solve the issue that the thickness of the active chip is limited.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
   a redistribution layer;
   a conductive pillar and an active chip disposed side by side on the redistribution layer, wherein the active chip comprises a pad;
   an encapsulation layer surrounding the active chip and the conductive pillar, wherein the encapsulation layer has a first through hole and a second through hole, the first through hole is disposed between the pad of the active chip and the redistribution layer, the second through hole is disposed between the conductive pillar and the redistribution layer, and a depth of the first through hole is less than a depth of the second through hole;
   another redistribution layer disposed on a side of the active chip away from the redistribution layer and electrically connected to the redistribution layer through the conductive pillar, wherein a number of dielectric layers of the another redistribution layer is less than a number of dielectric layers of the redistribution layer; and
   an anti-warping layer disposed on a side of the another redistribution layer away from the active chip, wherein a thickness of the anti-warping layer is at least twice a thickness of one of the dielectric layers of the another redistribution layer, a Young's modulus of the anti-warping layer is greater than a Young's modulus of polyimide, and the anti-warping layer comprises siloxane polymer, dry film type solder resist material or Ajinomoto laminated film.

2. The package structure as claimed in claim 1, wherein the redistribution layer comprises a first trace and a second trace, the first trace fills up the first through hole, and the second trace is disposed along a sidewall of the second through hole and a surface of the conductive pillar.

3. The package structure as claimed in claim 2, wherein the first trace and the second trace are formed of a conductive layer.

4. The package structure as claimed in claim 3, wherein the conductive layer comprises an interface layer and a metal layer sequentially disposed on the encapsulation layer, and the metal layer is disposed in the first through hole.

5. The package structure as claimed in claim 3, wherein the first trace contacts the pad.

6. The package structure as claimed in claim 1, wherein the one of the dielectric layers of the redistribution layer is disposed in the second through hole.

7. The package structure as claimed in claim 1, wherein the another redistribution layer comprises a conductive layer, the one of the dielectric layers of the another redistribution layer is disposed between the conductive layer and the anti-warping layer, the one of the dielectric layers has a third through hole, the anti-warping layer has a fourth through hole, and the third through hole and the fourth through hole expose the conductive layer.

8. The package structure as claimed in claim 7, wherein a sidewall of the third through hole is coplanar with a sidewall of the fourth through hole.

9. The package structure as claimed in claim 1, wherein the encapsulation layer is disposed between the redistribution layer and the active chip.

10. The package structure as claimed in claim 1, wherein an aperture of the first through hole is less than an aperture of the second through hole.

11. The package structure as claimed in claim 1, wherein the encapsulation layer comprises a photosensitive encapsulant material or a molding material.

12. The package structure as claimed in claim 1, further comprising a chip and a plurality of conductive terminals disposed on a side of the redistribution layer away from the active chip and electrically connected to the redistribution layer.

13. The package structure as claimed in claim 1, wherein a thickness of the active chip is greater than or equal to 200 micrometers.

\*   \*   \*   \*   \*